(12) United States Patent
Fukuchi

(10) Patent No.: US 10,634,556 B2
(45) Date of Patent: Apr. 28, 2020

(54) PHOTO-DETECTION DEVICE, IMAGING APPARATUS, AND IMAGING SYSTEM

(71) Applicant: CANON KABUSHIKI KAISHA, Tokyo (JP)

(72) Inventor: Yusuke Fukuchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 39 days.

(21) Appl. No.: 16/152,822

(22) Filed: Oct. 5, 2018

(65) Prior Publication Data

US 2019/0113385 A1 Apr. 18, 2019

(30) Foreign Application Priority Data

Oct. 13, 2017 (JP) .................... 2017-199601

(51) Int. Cl.
*G01J 1/44* (2006.01)
*H01L 27/146* (2006.01)
(Continued)

(52) U.S. Cl.
CPC .......... *G01J 1/44* (2013.01); *H01L 27/14612* (2013.01); *H01L 27/14636* (2013.01); *H01L 27/14643* (2013.01); *H01L 31/107* (2013.01); *H04N 5/37455* (2013.01); *G01J 2001/442* (2013.01); *G01J 2001/4406* (2013.01); *G01J 2001/4466* (2013.01); *H04N 5/376* (2013.01)

(58) Field of Classification Search
CPC ............. G01J 1/44; G01J 2001/4406; G01J 2001/4413; G01J 2001/446; G01J 2001/4466; G01J 2001/442; H01L 27/14612; H01L 27/14609; H01L 27/14601; H01L 27/146; H01L 27/14636; H01L 27/14643; H01L 31/107; H04N 5/37455; H04N 5/3745; H04N 5/376; H04N 5/374

See application file for complete search history.

(56) References Cited

U.S. PATENT DOCUMENTS

| 2001/0020673 A1* | 9/2001 | Zappa | ........................ | G01J 1/44 250/214 R |
|---|---|---|---|---|
| 2001/0020863 A1* | 9/2001 | Cova | ......................... | G01J 1/44 327/514 |

(Continued)

FOREIGN PATENT DOCUMENTS

JP 2006-179587 A 7/2006

*Primary Examiner* — John R Lee
(74) *Attorney, Agent, or Firm* — Venable LLP

(57) ABSTRACT

A photo-detection device includes an APD, a current detecting unit to which a signal via a first terminal of the APD is input, a load element connected to a node between the APD and the current detecting unit, a quench signal generating unit to which a signal from the current detecting unit is input and which outputs a quench signal, and a switch connected to a second terminal of the APD and a first wiring line to which first potential is supplied. The node is connected via the load element to a second wiring line to which second potential different from the first potential is supplied, and the quench signal generating unit generates a one-shot pulse signal as the quench signal based on the signal from the current detecting unit and causes the quench signal to be input to the switch.

12 Claims, 11 Drawing Sheets

(51) Int. Cl.
*H01L 31/107* (2006.01)
*H04N 5/3745* (2011.01)
*H04N 5/376* (2011.01)

(56) References Cited

U.S. PATENT DOCUMENTS

2005/0224903 A1* 10/2005 Augusto .............. H04N 5/3745
                                                          257/440
2008/0231339 A1*  9/2008 Deschamps ........ H03K 17/0416
                                                          327/326
2016/0223397 A1*  8/2016 Tsai .......................... G01J 1/44
2017/0102339 A1*  4/2017 Honda .................. G01N 21/956
2018/0090526 A1*  3/2018 Mandai ................ H04N 5/3577
2018/0372539 A1* 12/2018 Goden .................. H01L 31/107
2019/0113385 A1*  4/2019 Fukuchi .................... G01J 1/44
2019/0302242 A1* 10/2019 Fenigstein ............ H01L 31/107

* cited by examiner

PHOTO-DETECTION DEVICE, IMAGING APPARATUS, AND IMAGING SYSTEM

BACKGROUND OF THE INVENTION

Field of the Invention

An aspect of the present invention relates to a photo-detection device that performs photoelectric conversion, an imaging apparatus, or an imaging system.

Description of the Related Art

There has been a known photo-detection device using an avalanche photodiode having an active-quenching mechanism that forcibly stops avalanche current. Japanese Patent Application Laid-Open No. 2006-179587 discloses a photo-detection device that evaluates whether or not avalanche current has occurred and feeds back a quench signal output from quench signal generation unit to the avalanche photodiode when the avalanche current has occurred to perform quenching at high speed.

SUMMARY OF THE INVENTION

In the photo-detection device described in Japanese Patent Application Laid-Open No. 2006-179587, the quench signal is superimposed on a DC bias and the resultant bias is applied to the cathode. The photo-detection device shares a DC bias power source with another element or another photo-detection device in some cases. In this case, when the quench signal is fed back to the DC bias in a photo-detection device, the potential at the other element or the bias potential at the other photo-detection device that shares the same DC bias power source is also affected and therefore changes. There is therefore a possibility of abnormal operation of the other element, a change in the result of the photo-detection, or no photo-detection.

In a photo-detection device including an avalanche photodiode and sharing a power source with another element or another photo-detection device, an effect of a bias change due to a quench action performed by the photo-detection device on the other element or the other photo-detection device can be reduced or avoided.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photo-detection device in the present embodiment will be described with reference from FIG. 1 to FIGS. 3A and 3B.

Figure 1:
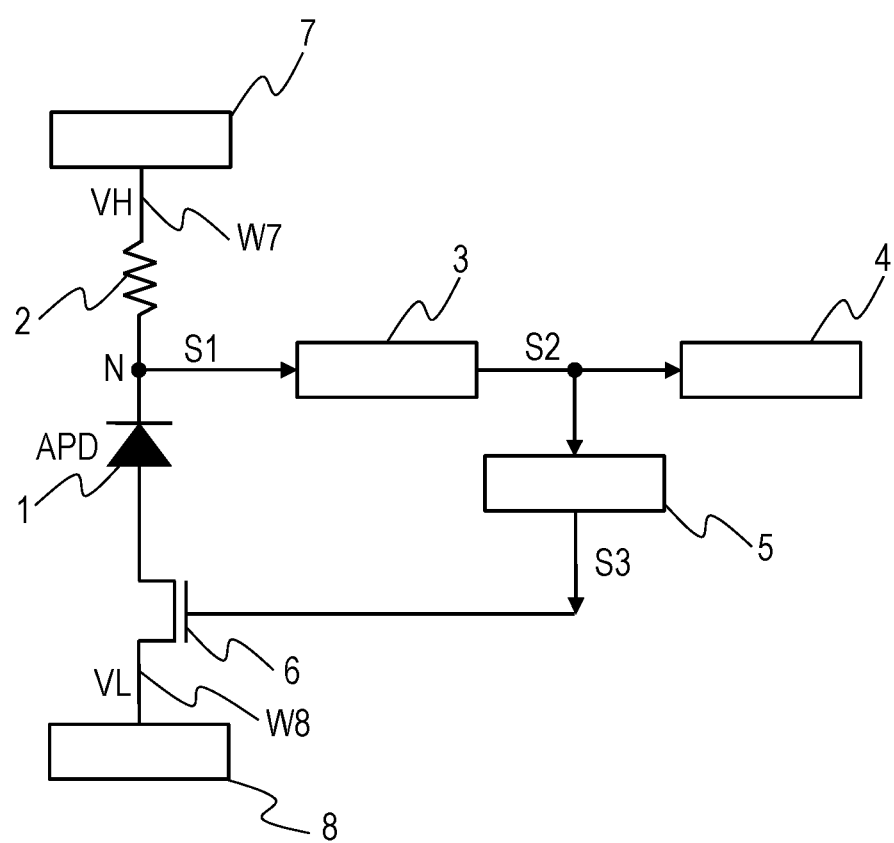
FIG. 1 is a block diagram of a photo-detection device according to a first embodiment.

FIG. 1 is a block diagram illustrating the configuration of the photo-detection device according to the present embodiment, and the photo-detection device includes an avalanche photodiode (hereinafter referred to as APD 1), a resistor element 2, which is a load element, a current detecting unit 3, a counter circuit 4, a quench signal generating unit 5, and a switch. The switch is a quench signal feedback switch, and can, for example, be a transistor 6, such as a MOS transistor.

In FIG. 1, a voltage signal S1, which is an output from a first terminal of the APD 1, is input to the current detecting unit 3. The resistor element 2, which is a load element, is connected to a node N between the APD 1 and the current detecting unit 3. A signal from the current detecting unit 3 is input to the quench signal generating unit 5, and the quench signal generating unit 5 outputs a one-shot pulse signal S3 as a quench signal based on a signal S2, which is the output from the current detecting unit 3.

The transistor 6, which is the switch, is connected to a second terminal of the APD 1 and a wiring line W8, through which first potential VL is supplied from a power source circuit 8, and the APD 1, the transistor 6, and the wiring line W8 are connected in series in the present order. The first terminal of the APD 1 is connected via the resistor element 2 to a wiring line W7, through which second potential VH is supplied from a power source circuit 7. In the present embodiment, the second potential VH is higher than the first potential VL, and the first terminal of the APD 1 is the cathode, and the second terminal of the APD 1 is the anode, but not necessarily. The magnitudes of the first potential and the second potential may be reversed, and the anode the cathode may be reversed.

The first potential VL and the second potential VH are so set that the difference between the first potential VL and the second potential VH is higher than at least breakdown voltage Vb of the APD 1 so that avalanche multiplication occurs in the APD 1. For example, in the present embodiment, the breakdown voltage Vb of the APD 1 can be set at 10 V, the first potential VL can be set at −9 V, and the second potential VH can be set at +3 V. In this case, the difference between the first potential VL and the second potential VH is 12 V, which is higher than the breakdown voltage Vb, which is 10 V, whereby a reverse bias is applied to the APD 1.

The resistor element 2 has the function of performing a quench action of lowering the voltage across the resistor element 2 when avalanche current occurs to suppress the avalanche multiplication. The resistor element 2 can be an element that lowers the potential at the node N with respect to the first potential VL when the avalanche current occurs to allow the quench action.

The current detecting unit 3 is a circuit that detects occurrence of the avalanche current based on a change in the potential at the node N (potential at cathode of APD 1) caused to occur by the resistor element 2 when the avalanche current occurs. The change in the voltage carried by the voltage signal S1 caused to occur when the avalanche current occurs is shaped in terms of waveform by the current detecting unit 3, and the resultant signal is output as the signal S2, which is a pulse signal.

Figure 2:
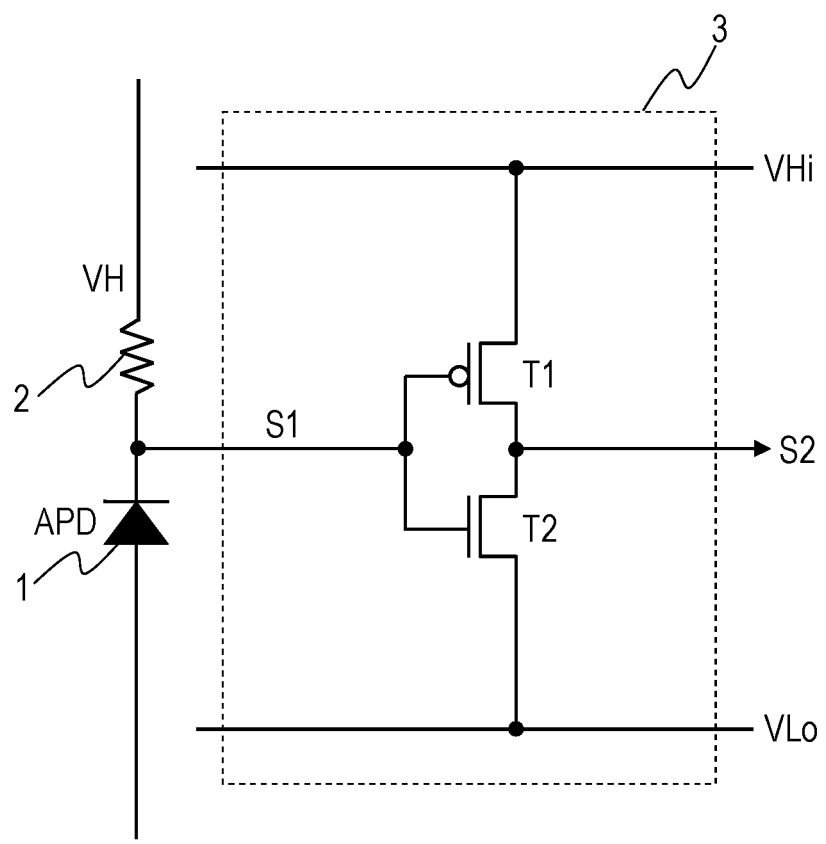
FIG. 2 illustrates a current detecting unit according to the first embodiment.

As an example of the configuration of the current detecting unit 3, a case where the current detecting unit 3 is formed of an inverter will be described with reference to FIG. 2 in the present embodiment. The voltage signal S1 is input to the gates of transistor T1 and T2, which form the inverter. FIG. 2 illustrates a case where the transistor T1 is a P-type MOS transistor and the transistor T2 is an N-type MOS transistor. A threshold Vth of the transistors T1 and T2 is lower than the second potential VH.

In a state in which no avalanche current has occurred and no voltage drop due to the resistor element 2 has occurred, the voltage signal S1 is the second potential VH. At this point, the state of the transistor T2 is the on-state, and a low-level signal is output as the signal S2. As the low-level signal, a 0-V signal can, for example, be output. On the other hand, when the avalanche current has occurred, and voltage drop due to the resistor element 2 has occurred, the voltage signal S1 is lower than the threshold Vth of the transistors T1 and T2. During this period, the state of the transistor T1 is the on-state and the state of the transistor T2 is the off-state, so that a high-level signal is output as the signal S2. As the high-level signal, a 3.3-V voltage signal can, for example, be output.

That is, the current detecting unit 3 outputs the low-level signal when the voltage signal S1 (potential at node N) is higher than or equal to the threshold Vth and outputs the high-level signal when the voltage signal S1 is lower than the threshold Vth. The threshold Vth of the transistors T1 and T2, that is, the threshold of the current detecting unit 3 is set at potential lower than the second potential VH but higher than the first potential VL.

The case where an inverter is used as the current detecting unit 3 has been shown, but not necessarily. For example, a comparator circuit or any other appropriate circuit can be used as the current detecting unit 3.

The signal S2 output from the current detecting unit 3 is input to a counter circuit 4 and the quench signal generating unit 5. The counter circuit 4 is, for example, an N-bit counter (N is positive integer) and can count a pulse signal produced by a single photon until the count reaches about 2N. A signal representing the count is held as a detection signal by the counter circuit 4.

The quench signal generating unit 5 is a circuit that outputs the quench signal for suppressing occurrence of the avalanche current for a fixed period. The quench signal generating unit 5 can output the one-shot pulse signal S3 having a predetermined pulse width W1 as the quench signal based on the signal S2 output from the current detecting unit 3. For example, the quench signal generating unit 5 can be adapted to output the high-level signal when the signal S2 is greater than the threshold of the quench signal generating unit 5 and the low-level signal when the signal S2 is smaller than or equal to the threshold of the quench signal generating unit 5. The one-shot pulse signal S3 is a signal for controlling the reverse bias applied to the APD 1 via the switch to achieve active quenching.

The one-shot pulse signal S3 is a signal that causes the switch to operate in such a way that the reverse bias voltage applied to the APD 1 is lower than breakdown voltage Vbd during the period for which the one-shot pulse signal S3 has the high level (or low level), as will be described later. No avalanche multiplication therefore occurs in the APD 1 during the period for which the one-shot pulse signal S3 has the high level (or low level).

In the photo-detection device shown in the present embodiment, to reliably perform the quench action after a photon is detected, a high-level (or low-level) quench signal needs to be generated for a period longer than at least recovery time of the cathode potential.

Figure 3A:
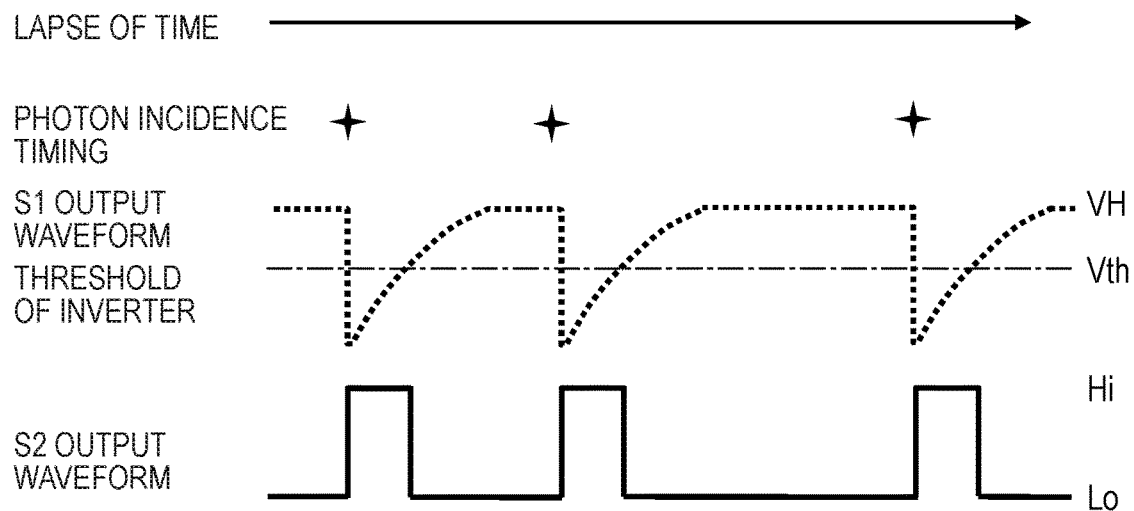
FIGS. 3A and 3B are each a timing chart of a variety of signals in a case where a photon is incident on a photo-detection device including no quench signal feedback unit.

The reason for the necessity described above will be described with reference to FIGS. 3A and 3B. FIG. 3A is a conceptual diagrammatic view in a case where the photo-detection is performed in a low illuminance condition and illustrates a temporal change in the voltage signal S1 output from the APD 1 when a photon is incident thereon and a temporal change in the signal S2.

Photoelectrons generated when a photon is incident on the APD 1 produce the avalanche current, and voltage drop due to the resistor element 2 therefore occurs. As a result, the voltage signal S1, which is the output from the first terminal of the APD 1, is so reduced as to be lower than the threshold Vth of the current detecting unit 3. At this point, the signal S2 output from the current detecting unit 3 rises from the low level, and the current detecting unit 3 outputs the high-level voltage signal. During a period for which the voltage signal S1 is smaller than the threshold of the current detecting unit 3, the current detecting unit 3 outputs the high-level signal as the signal S2.

When the potential at the first terminal (cathode potential) of the APD 1 recovers, and the voltage signal S1 is therefore greater than the threshold Vth of the current detecting unit 3, the signal S2 rises and the current detecting unit 3 outputs the low-level voltage signal as the signal S2. During a period for which the voltage signal S1 is greater than or equal to the threshold of the current detecting unit 3, the current detecting unit 3 outputs the high-level signal as the signal S2.

The thus acting current detecting unit 3 outputs the change in the potential at the cathode of the APD 1 (potential at node N) in the form of the signal S2 so shaped by the current detecting unit 3 in terms of waveform into a pulse signal.

The counter circuit 4, to which the signal S2 is input from the current detecting unit 3, counts the number of pulse waveforms described above. In the case where the illuminance is low, the photon incidence interval is long. Since the photon incidence interval is longer than the recovery time of the potential at the cathode of the APD 1, the pulses are separate from each other, and one square-wave signal is output as the output signal S2 on a photon basis.

Figure 3B:
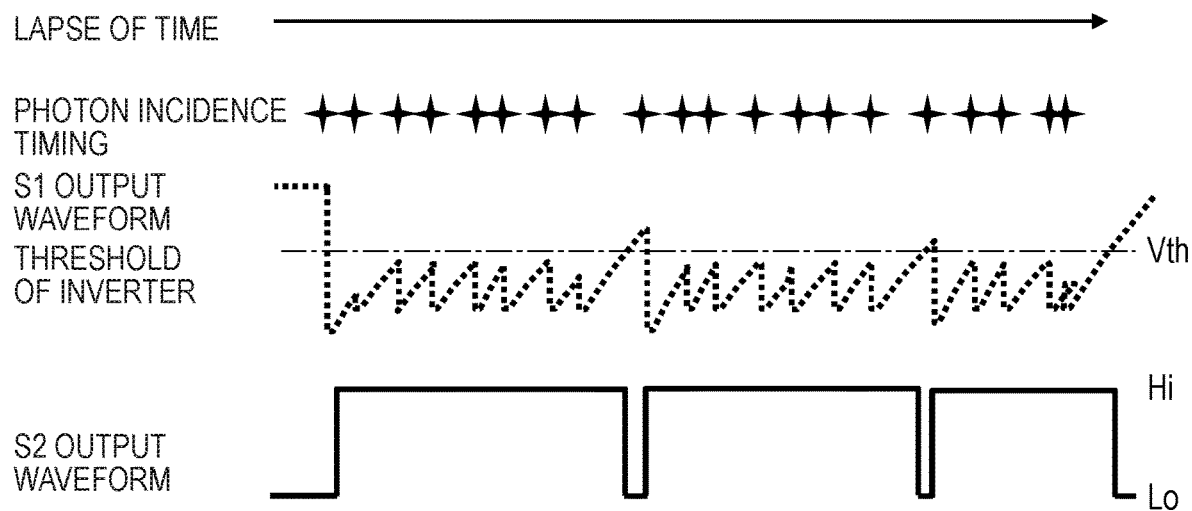

FIG. 3B illustrates that the same photo-detection device performs the photo-detection in a case where the illuminance is high. The voltage drop caused by incidence of a photon causes the current detecting unit 3 to output the high-level signal as the signal S2, as in FIG. 3A.

Thereafter, by the time when the avalanche current stops and the cathode potential recovers to a value greater than the potential beyond which breakdown is allowed again and further exceeds the threshold voltage of the current detecting unit 3, another photon is incident on the APD 1 in some cases. The higher the illuminance, that is, the greater the number of incident photons per unit time, the higher the frequency at which another photon is incident on the APD 1 before the cathode potential exceeds the threshold voltage of the current detecting unit 3.

In this case, before the potential at the cathode of the APD 1 exceeds the threshold Vth of the current detecting unit 3, the following avalanche current occurs, and the cathode potential in the middle of the recovery lowers again. Therefore, the potential of the signal S2 output from the current detecting unit 3 does not fall, and the high-level signal is prolonged and output in some cases.

In this case, the counter circuit 4, to which the output signal S2 is input, counts the output signal S2 that is the high-level signal prolonged due to continuous incidence of a plurality of photons as one pulse signal. The number of photons is therefore falsely detected, that is, the number of detected photons is smaller, although the number of actually incident photons is greater, than the number of photons in a case where the intervals at which photons are incident on the APD 1 are slightly longer than the recovery time of the potential at the cathode of the APD 1.

Figure 4:
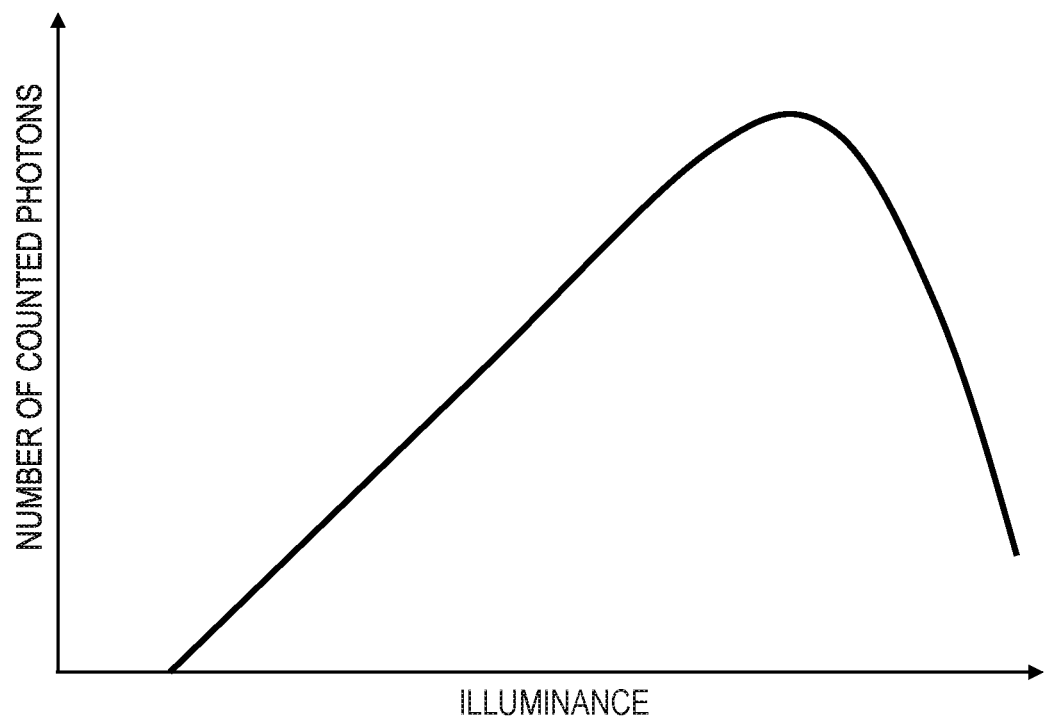
FIG. 4 illustrates the relationship between illuminance and the number of photons counted by the photo-detection device including no quench signal feedback unit.

FIG. 4 illustrates the relationship between the illuminance and the number of photons detected by the photo-detection device. FIG. 4 illustrates that the number of detected photons increases as the illuminance increases, and that the number of detected photons decreases after the number peaks at a certain value of illuminance.

On the other hand, in the present embodiment, the quench period is so set as to be longer than the recovery time necessary for the cathode potential to exceed at least the threshold of the current detecting unit 3. The decrease in the number of detectable photons can thus be avoided.

The above-mentioned effect will be described with reference to FIGS. 5A and 5B. In FIG. 5B, a recovery time Tc is the time necessary for the potential at the cathode of the APD 1 having lowered due to single occurrence of the avalanche multiplication to exceed the threshold of the current detecting unit 3 again. Further, in FIGS. 5A and 5B, W1 represents the period for which high-level quench signal (one-shot pulse signal S3) is output, that is, the pulse width of the one-shot pulse signal S3.

Figure 5A:
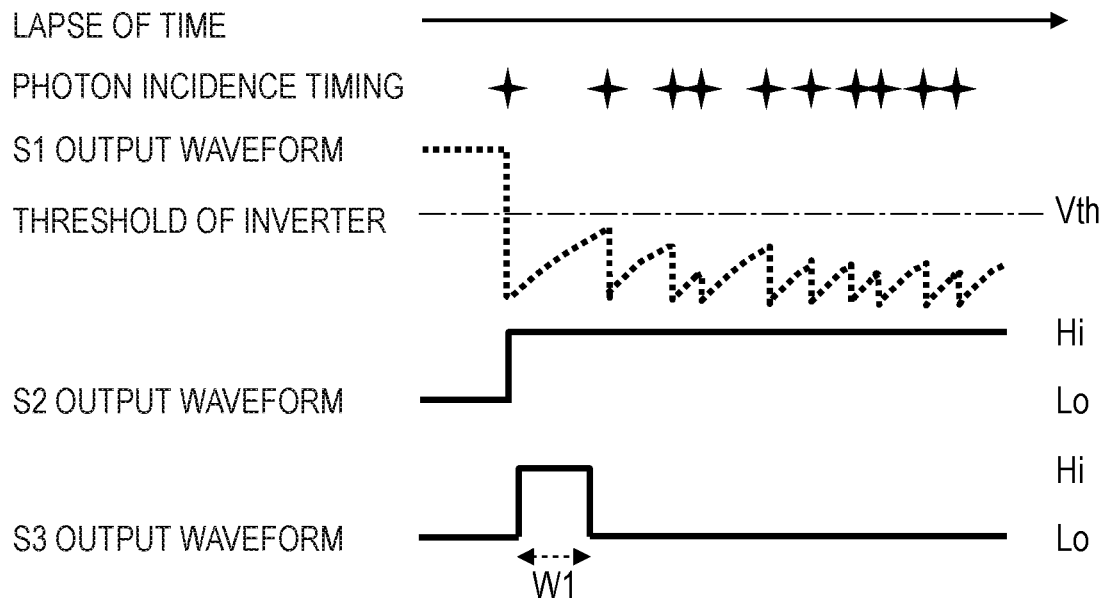
FIGS. 5A and 5B are each a timing chart of a variety of signals in a case where a photon is incident on a photo-detection device according to the first embodiment.
Figure 5B:
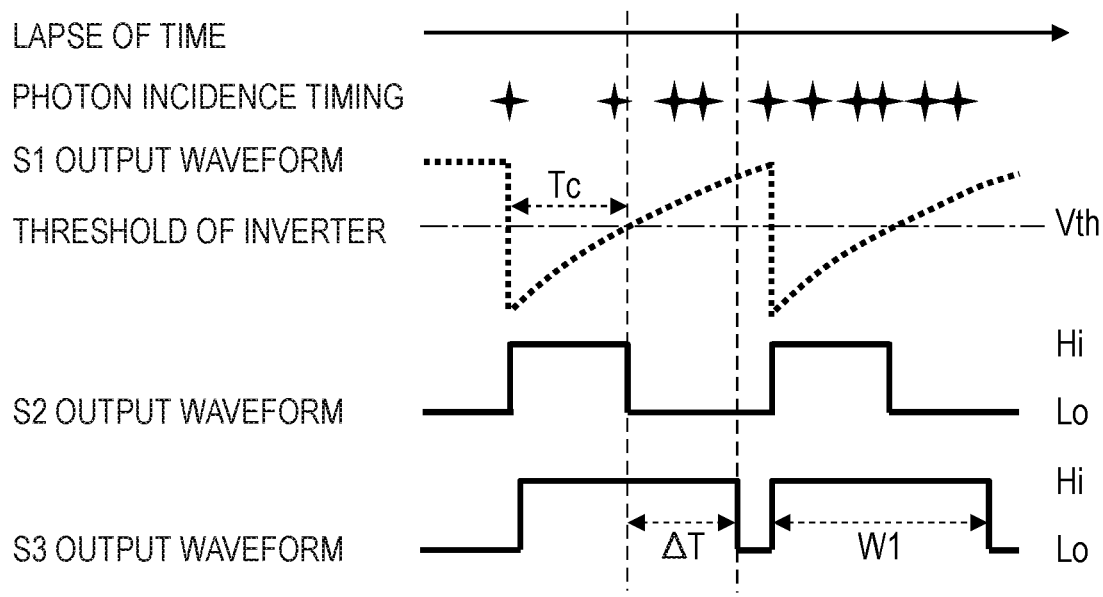

FIG. 5A is a timing chart in a case where W1≤Tc, and FIG. 5B is a timing chart in a case where W1>Tc.

In the case where W1≤Tc illustrated in FIG. 5A, during the period for which the potential at the cathode of the APD 1, that is, the potential at the node N is smaller than the threshold Vth of the current detecting unit 3, the output level of the one-shot pulse signal S3 decreases to the low level. When a photon is incident on the APD 1 during the period for which the cathode potential is smaller than the threshold of the current detecting unit 3 and the output level of the one-shot pulse signal S3 is the low level, the avalanche multiplication occurs again. As a result, the cathode potential in the middle of the recovery lowers again. When the situation described above continuously repeated, the signal S2 output from the current detecting unit 3 keeps outputting the high-level signal S2, so that the counter circuit 4 counts the output signal S2 as one pulse. As a result, the count of detected photons is likely to be smaller than the count of actually incident photons.

On the other hand, in the case where W1>Tc illustrated in FIG. 5B, the one-shot pulse signal S3 maintains the high-level output for a period of ΔT (=W1−Tc) after the cathode potential exceeds the threshold of the current detecting unit 3. Even if a photon is incident on the APD 1 during the period, no avalanche multiplication occurs in the APD 1, and the cathode potential keeps recovering (rising), so that the cathode potential eventually exceeds the threshold Vth of the current detecting unit 3. The signal S2 from the current detecting unit 3 therefore reliably falls to the low level by the time when the high-level one-shot pulse signal S3 is output. No pulse in the signal S2 from the current detecting unit 3 therefore keeps being prolonged.

That is, in the case where W1≤Tc illustrated in FIG. 5A and the illuminance is high, a period for which no photon can detected is likely to last after single occurrence of the avalanche multiplication in the APD 1. On the other hand, in the case where W1>Tc illustrated in FIG. 5B, the pulse width of the one-shot pulse, which is the quench signal, is so defined that the potential at the cathode of the APD 1 reliably and forcibly recovers. Therefore, under the same illuminance, the number of countable photons can be increased as compared with the case illustrated in FIG. 5A, whereby a decrease in precision of the photo-detection can be suppressed.

As described above, to avoid a decrease in the number of detected photons in the photo-detection performed under the high illuminance condition, the pulse width W1 of the one-shot pulse signal S3 can be at least longer than the recovery time Tc of the potential at the cathode of the APD 1. There is no specific upper limit of the pulse width W1 of the one-shot pulse signal S3, but a longer pulse width W1 prolongs an insensitive period in which no avalanche multiplication occurs. In this case, an incident photon cannot be detected during the insensitive period, resulting in a decrease in the sensitivity of the photo-detection device. The upper limit of the pulse width W1 of the one-shot pulse signal S3 can therefore be about twice the recovery time Tc of the potential at the cathode of the APD 1, at the longest.

Setting the pulse width W1 of the one-shot pulse signal S3 to fall within a range Tc<W1≤2·Tc prevents pulse prolongation of the signal S2 and allows photo-detection with high sensitivity maintained.

Figure 6:
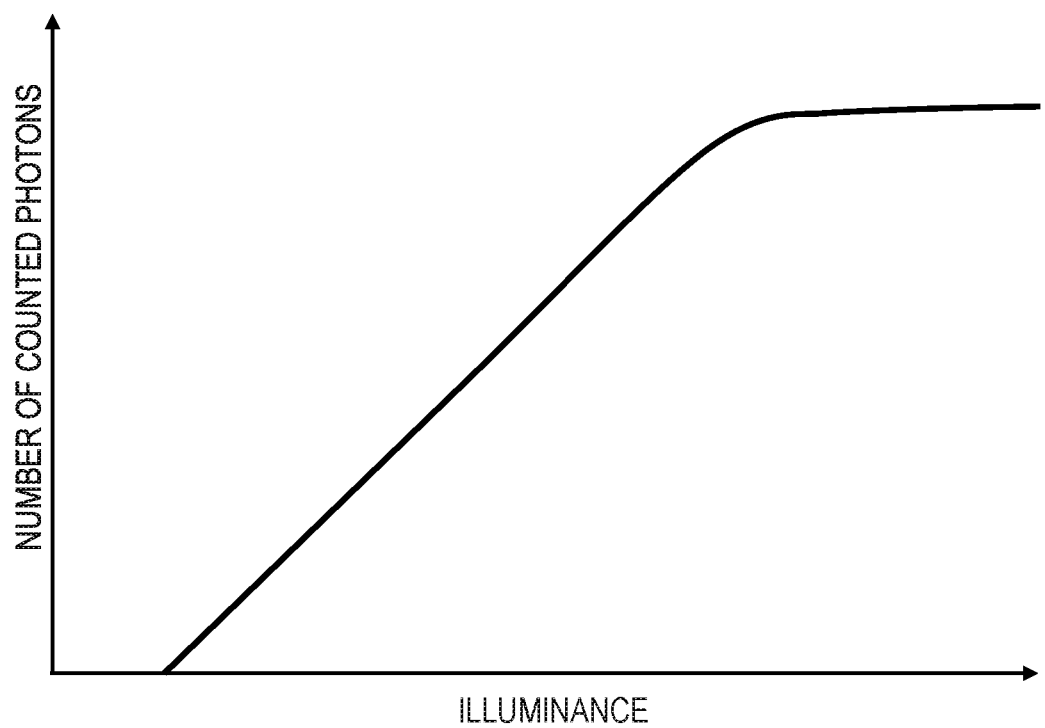
FIG. 6 illustrates the relationship between illuminance and the number of photons counted by the photo-detection device according to the first embodiment.

In the thus adapted photo-detection device according to the present embodiment, the number of detected photons does not decrease as the illuminance increases even in the photon detection under illuminance higher than a fixed level, as illustrated in FIG. 6. That is, a decrease in precision of the photo-detection under high illuminance can be suppressed.

The above description has been made of the case where an inverter is used as the current detecting unit 3. Also in a case where another circuit is used as the current detecting unit 3, the same problem is likely to occur in the evaluation of whether or not the avalanche current occurs based on a certain threshold level as a reference. Using the configuration in the present embodiment can provide the same effect.

The pulse width W1 of the one-shot pulse signal S3, which is the quench signal, can be determined with reference, for example, to the recovery time Tc of the potential at the cathode of the APD 1 (potential at node N) as described above. The recovery time Tc may, for example, be the time constant used when the potential at the cathode of the APD 1 having lowered due to occurrence of the avalanche current recovers. The time constant is what is called dead time and can be determined as the product of the resistance and capacitance of a photon detecting unit. Dead time τd is determined by the following expression:

$$\tau d = R(Cpd + C)$$

where Cpd represents the capacitance of the PN junction of the APD 1, C represents the parasitic capacitance of the wiring and diffusion layer, and R represents the resistance of the resistor element.

Figure 7:
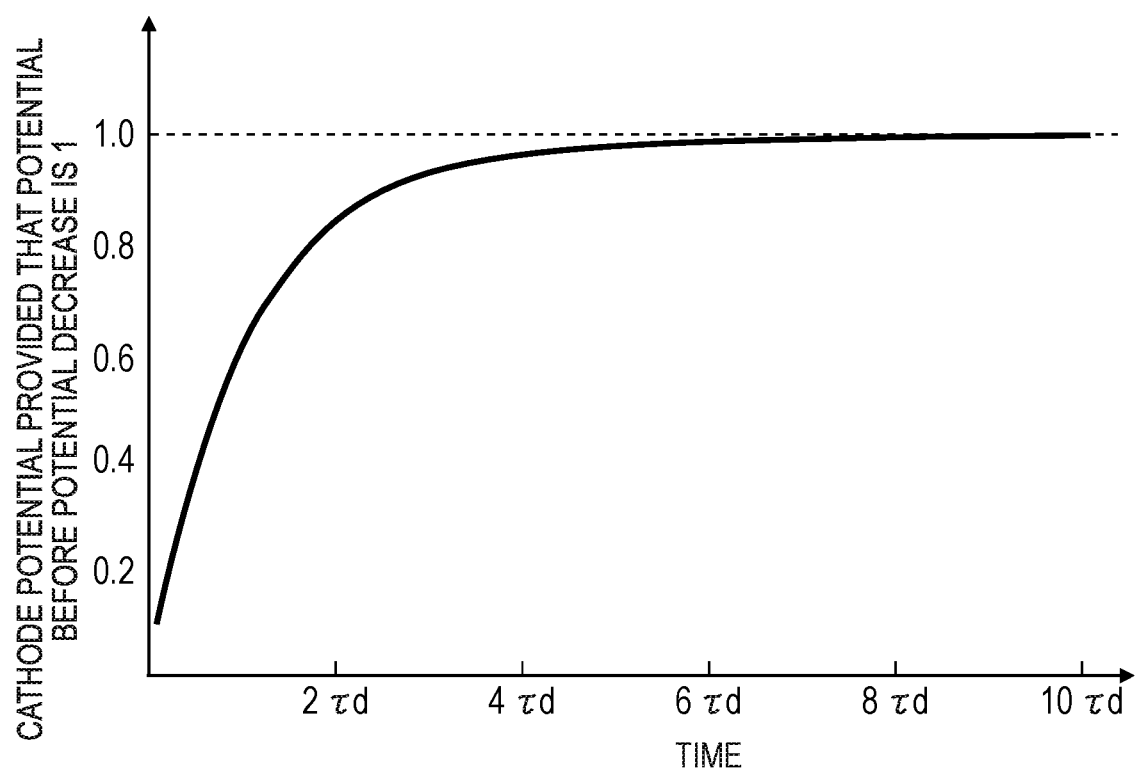
FIG. 7 illustrates recovery of cathode potential according to the first embodiment.

FIG. 7 illustrates a temporal change in the recovery of the potential at the cathode of the APD 1 having lowered due to occurrence of the avalanche current, and the vertical axis represents a relative value of the potential at the cathode of the APD 1 with the potential before the potential drop being one. The potential at the cathode of the APD 1 (potential at node N) having lowered due to the avalanche current exponentially recovers after the potential drop with respect to the time constant τd.

In FIG. 7, for example, at the point of time when 2τd, which is twice the time constant, elapses, the potential at the cathode of the APD 1 recovers to about at least 80% of the potential before the potential drop. The potential thereafter gradually keeps recovering and roughly recovers to the potential before the potential drop at the time 6τd or later. To sense whether or not current occurs based on the result of comparison of the potential at the cathode of the APD 1 with a certain threshold level, a threshold can be set in a region where the potential at the cathode of the APD 1 sharply rises in the recovery because temporal variation is small. Therefore, for example, any potential at the cathode of the APD 1 by the time earlier than twice the dead time τd is used as the threshold level of the current detecting unit 3.

Further, to avoid the situation in which the avalanche multiplication occurs due to the following photon before the potential at the cathode of the APD 1 recovers so that the photon cannot be counted, the cathode potential preferably recovers to at least 80% of the potential before the potential drop. Therefore, the quench signal (one-shot pulse signal S3) preferably has the switch-turn-off level (high level in the description) for a period longer than 2τd. To this end, the pulse width W1 of the one-shot pulse signal S3 can be set at a width corresponding to at least twice the dead time τd.

Further, there is no specific upper limit of the pulse width W1, as in the case described above. Too long a pulse width W1, however, prolongs the insensitive time. The pulse width W1 of the one-shot pulse signal S3 can therefore be a width corresponding, for example, to a period shorter than 6 times the dead time τd, which allows the potential at the cathode of the APD 1 to roughly fully recover, as illustrated in FIG. 7.

Figure 8A:
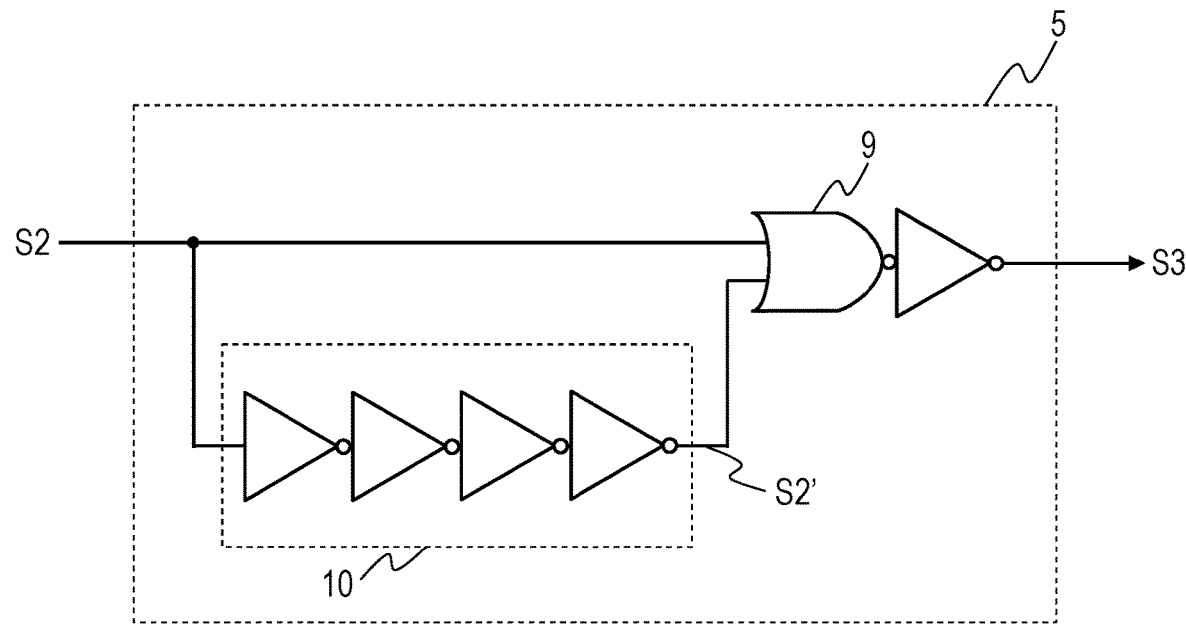
FIGS. 8A and 8B illustrate a quench signal generating unit according to the first embodiment.

An example of the configuration and action of the quench signal generating unit 5 will next be described with reference to FIGS. 8A and 8B. The quench signal generating unit 5 in the present embodiment illustrated in FIG. 8A includes a NOR circuit 9 and a delay circuit unit 10, which is formed of an even number of inverters.

The signal S2 from the current detecting unit 3 is input to the NOR circuit 9 and the delay circuit unit 10, and the signal S2 input to the delay circuit unit 10 is delayed and then supplied to another input of the NOR circuit 9. When the signal S2 rises from the low level to the high level, the signal level of the output signal (S3) also rises. When the signal S2 falls from the high level to the low level, a signal S2' output from the delay circuit unit 10 is delayed by the delay circuit unit 10 by the period corresponding to the pulse width W1, then falls from the high level to the low level, and is input to the NOR circuit 9.

Figure 8B:
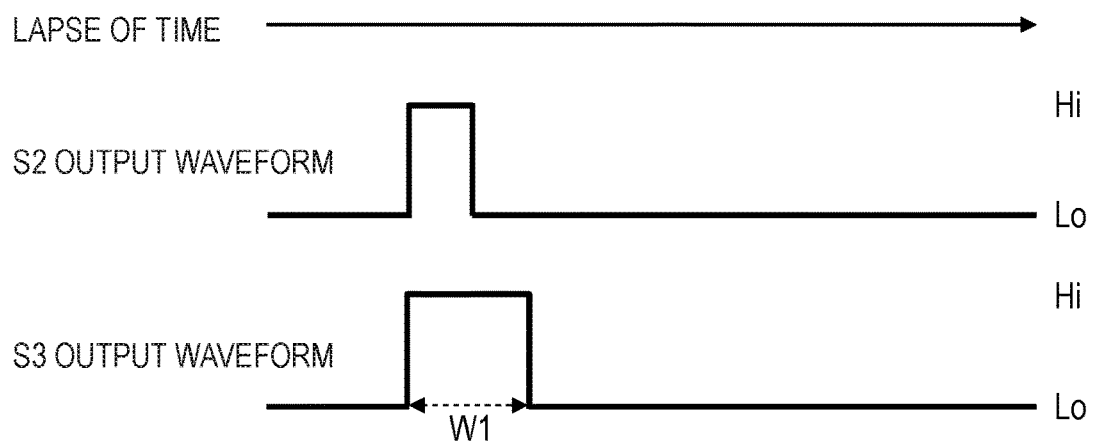

The output from the quench signal generating unit 5 is therefore the one-shot pulse signal S3 having the pulse width W1 corresponding to the delay generated by the delay circuit unit 10 after the signal S2 rises to the high level, as illustrated in FIG. 8B. That is, the delay circuit unit 10 controls the pulse width W1 of the one-shot pulse signal S3.

The configuration of the quench signal generating unit 5 is not limited to the inverter-type delay circuit described above. For example, the quench signal generating unit 5 can be formed of a one-shot pulse generation circuit using a CR-type delay circuit or any other circuit capable of outputting a signal having a predetermined pulse width. Further, the pulse width W1 is not necessarily fixed. For example, a plurality of delay circuit units that generates different delay time periods may be prepared and may produce arbitrary delay time periods.

The switching action of the transistor 6, which receives the one-shot pulse signal S3 output from the quench signal generating unit 5, will next be described.

The one-shot pulse signal S3 output from the quench signal generating unit 5 is input to the gate of the transistor 6 and used to control switching of the electrical connection between the source and the drain. In the present embodiment, the description will be made of a case where the transistor 6 is a depletion-type MOS transistor.

When the high-level one-shot pulse signal S3 is input to the gate of the transistor 6, the transistor 6 is turned off. On the other hand, in a state in which no high-level one-shot pulse signal S3 is input to the gate of the transistor 6, the state of the transistor 6 is the turn-on state, and the source and the drain of the transistor 6 are electrically connected to each other.

When the state of the transistor 6 is the turn-on state, the first potential VL supplied from the power source circuit 8 is fed to the anode of the APD. As a result, reverse bias greater than the breakdown voltage Vb of the APD 1 is applied to the PN junction, so that the avalanche multiplication is ready to occur.

On the other hand, in the case where the high-level one-shot pulse signal S3 input to the gate of the transistor 6, the transistor 6 is turned off, and the source and the drain are electrically disconnected from each other, so that the electricity is not fed from the power source circuit 8 to the anode of the APD 1. At this point, the reverse bias applied to the PN junction of the APD 1 is smaller than the breakdown voltage Vbd, so that the avalanche multiplication is not ready to occur.

The above description has been made of the case where the transistor 6 is a depletion-type MOS transistor, but not necessarily. For example, an enhancement-type MOS transistor may be used. In this case, for example, the same action can be achieved by reversing the signal of the output one-shot pulse signal S3 and inputting the reversed signal to the gate of the transistor 6.

The photo-detection device according to the present embodiment feeds back the quench signal to the gate of the transistor 6, which controls the connection between the anode of the APD 1 and the power source circuit 8 to change the state of the potential applied to the anode by the switching action of the transistor 6, as described above. That is, the one-shot pulse signal S3, which is the quench signal, switches the state of the switch, which controls the connection between the anode of the APD 1 and the power source circuit 8, from the on-state to the off-state and vice versa.

In a case where voltage is superimposed on the voltage across the wiring that connects the power source circuits 7 and 8 to the APD 1 to control the application of the reverse bias across the APD 1, the superimposed voltage changes the potential at the wiring. Therefore, in a case where another element or the current detecting unit 3 of another APD 1 is connected to the wiring, the other element or the current detecting unit 3 of the other APD 1 is affected by the change in the potential and is unlikely to normally operate.

On the other hand, the photo-detection device according to the present embodiment controls the application of the reverse bias across the APD 1 by turning the switch on and off. The quench action hardly changes the potential at the wiring between one of the power source circuit 7 and 8 and the switch. That is, the photo-detection device according to the present embodiment allows reduction in a change in the potential at the wiring that connects the power source circuits 7 and 8 to the APD 1 due to the quench action. As a result, the quench action can be so performed that the effect on another element connected to the wiring is reduced, as compared with the case where voltage is superimposed on the voltage across the wiring that connects the power source circuits 7 and 8 to the APD 1 for control.

For example, consider a case where a plurality of pixels shares the power source circuit 8 and one of the pixels is so adapted that potential resulting from the quench signal is directly superimposed on the potential across the wiring that connects the power source circuit 8 to the APD 1. In this case, in another pixel that shares the same power source circuit 8, the potential at the node N connected to the power source circuit 8 is affected by the quench signal and changes accordingly. Therefore, since the signal input to the current detecting unit 3 changes, the result of the photo-detection is likely to deviate from a true value or no photo-detection can be performed.

On the other hand, in the photo-detection device according to the present embodiment, the quench signal switches the on-state and the off-state of the switch, which controls the connection between the power source circuit 8 and the APD 1, from one to the other. That is, the quench signal is not superimposed on the potential across wiring that connects the power source circuit 8 to the APD 1. Therefore, even when a plurality of pixels shares the power source circuit 8, the quench action in a pixel only changes the potential supplied from the power source circuit 8 to another pixel by a very small amount. The effect of the quench action in a pixel on the photo-detection in another pixel can therefore be reduced or avoided.

It is noted that the power source circuit 8 is not shared but current from each of power source circuits 8 independent of one another can be supplied to the corresponding pixel. In this case, however, discrepancies in voltage among the power source circuits 8 change the outputs from the pixels, and it is likely to be difficult to produce a uniform output image.

Further, in the present embodiment, for example, the quench action is not performed independently of occurrence of the avalanche multiplication in the APD 1 but is performed based on the avalanche multiplication detection performed by the current detecting unit 3, for example, by inputting the quench action on a regular basis. In the case where the quench action is performed independently of occurrence of the avalanche multiplication, the quench action is likely to start during a period for which no photon is incident, and a photon is likely to be incident during the quench action period, so that the incidence of the photon cannot be counted even in under low illuminance.

On the other hand, in the present embodiment, the quench action is performed whenever incidence of a photon is detected. The present embodiment can therefore avoid the failure of photon counting due to the configuration in which the quench action starts during the period for which no photon is incident. That is, the precision of the photo-detection performed by the photo-detection device can be improved.

A photo-detection device that allows improvement in the precision of the photo-detection while reducing the effect on another element connected to the common power source circuit can therefore be achieved.

Further, in the present embodiment, the period for which the state of the quench signal is the on-state (the quench signal has the high level in the description) is longer than the period for which the avalanche current stops and breakdown can occur again in the APD 1. The pulse width W1 of the one-shot pulse signal S3 is thus controlled. As a result, a decrease in the precision of the photo-detection signal can be suppressed in a case where the photo-detection device receives light having a photon that reaches the APD 1 during a period shorter than the period for which the avalanche current of the APD 1 stops.

Further, it is conceivable to employ, for example, another method for controlling the potential at the anode by superimposing the potential supplied from a power source circuit on the potential of the quench signal with the aid of one of an adder and subtractor circuit formed of an operational amplifier. Such a circuit, however, limits the responsiveness due to a plurality of transistors and phase compensation capacitance. On the other hand, in the present embodiment, only the switching action of one transistor allows the potential control, whereby quench action that excels in response speed can be achieved.

Second Embodiment

Figure 9:
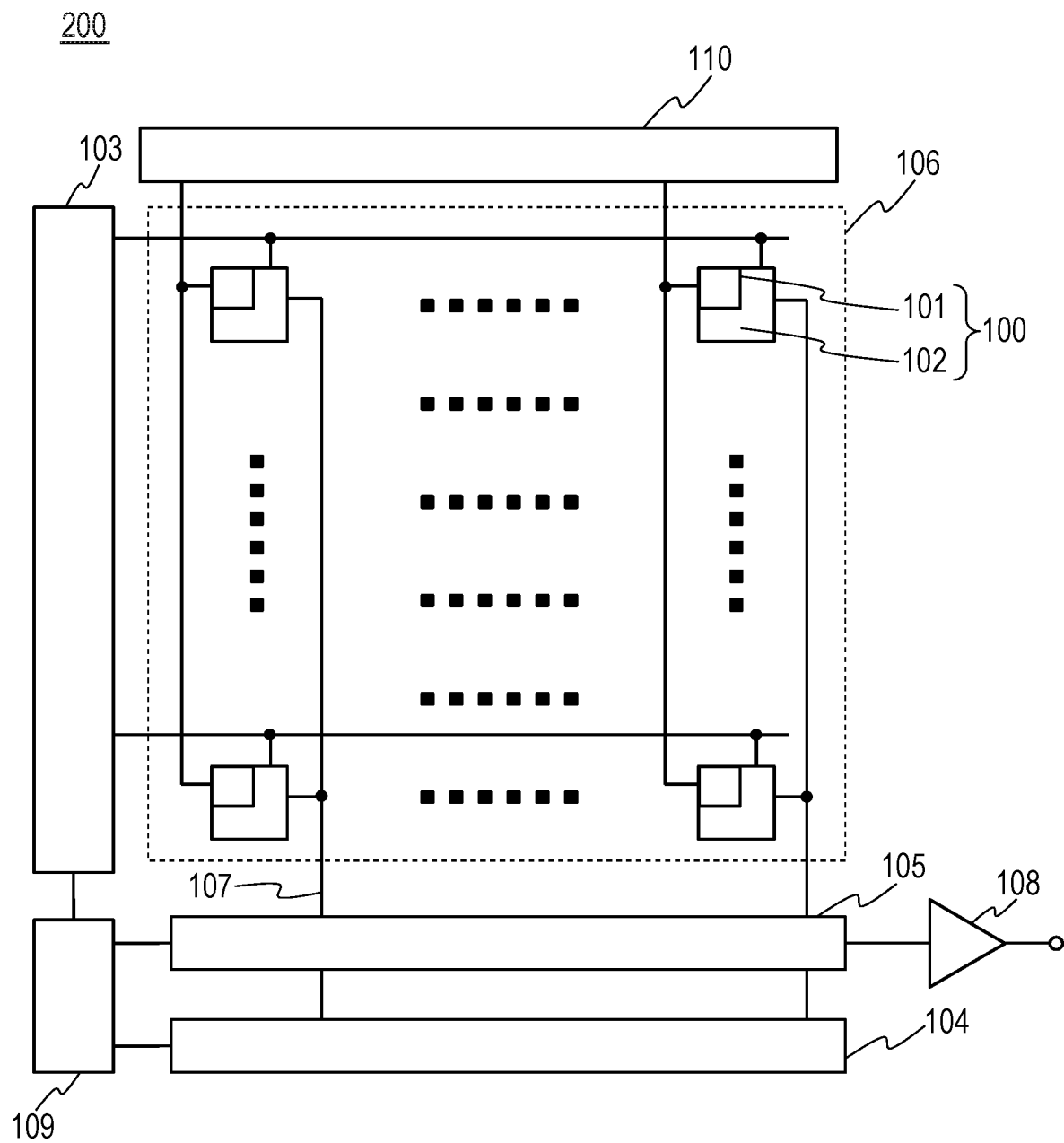
FIG. 9 is a block diagram of an imaging apparatus 200 according to a second embodiment.
Figure 10:
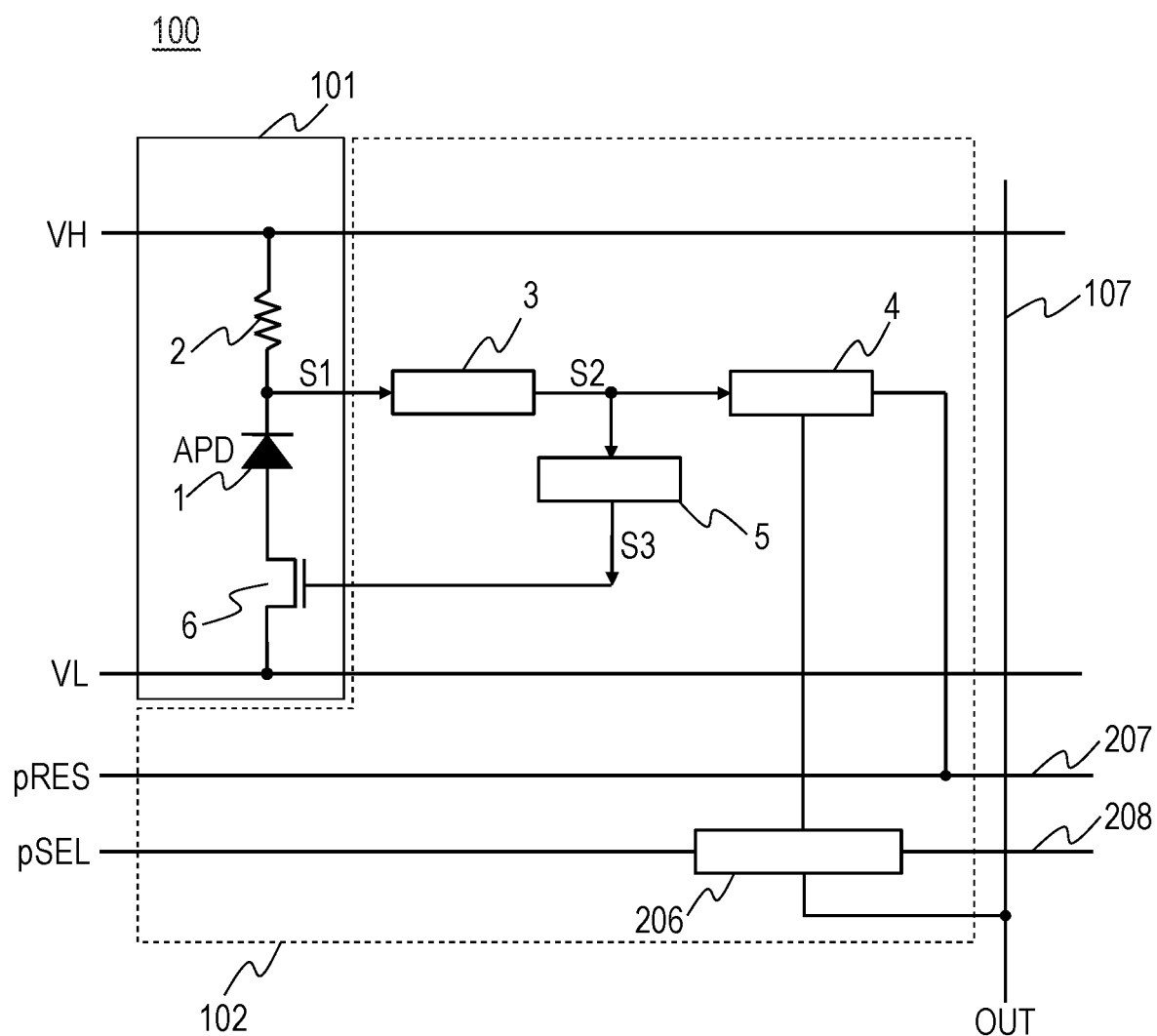
FIG. 10 is a block diagram of a pixel unit 106 according to the second embodiment.

An example of an imaging apparatus will be descried with reference to FIGS. 9 and 10. In the present embodiment, the same configurations, materials, effects, functions, drive method, and other factors as those in the first embodiment will not be described except part thereof.

FIG. 9 is a block diagram of an imaging apparatus 200 having a plurality of photo-detection devices. The APD 1, which forms each pixel, the variety of elements for signal processing, the method for feeding back the quench signal, and other factors are the same as those in the first embodiment, therefore have the same reference characters, and will not be described in detail, as described above.

The imaging apparatus 200 includes a pixel unit 106, a control pulse generating unit 109, a horizontal scan circuit unit 104, column circuits 105, signal lines 107, a vertical scan circuit unit 103, and a power source circuit unit 110. A plurality of pixels 100 is arranged in a matrix in the pixel unit 106. The plurality of pixels 100 each include a photoelectric conversion element 101, which functions as an avalanche photodiode, and a pixel signal processing unit 102. The photoelectric conversion element 101 converts light into an electric signal. The pixel signal processing unit 102 outputs the converted electric signal to the column circuits 105. The vertical scan circuit unit 103 receives control pulses supplied from the control pulse generating unit 109 and supplies the control pulses to the pixels 100. The vertical scan circuit unit 103 is formed of logic circuits, such as a shift register and an address decoder.

The signal lines 107 supply a circuit on the downstream side of the pixels 100 with signals output from the pixels 100 selected by the vertical scan circuit unit 103 as potential signals. The column circuits 105 are connected to the corresponding signal lines 107, receive the signals from the plurality of corresponding pixels 100 via the signal lines 107, and perform predetermined processing on the input signals. The predetermined processing is the process of removing noise from the input signals, amplifying and otherwise processing the input signals, and converting the resultant signals into a form to be output from the imaging apparatus. The column circuits 105 each include, for example, a parallel-serial conversion circuit.

The horizontal scan circuit unit 104 supplies the column circuits 105 with control pulses for successively outputting the signals processed by the column circuits 105 to an output circuit 108. The output circuit 108 includes a buffer amplifier, a differential amplifier, and other components and outputs the signals output from the column circuits 105 to one of a recording unit and a signal processing unit external to the imaging apparatus 200. The power source circuit unit 110 includes at least one of the power source circuits 7 and 8 in the first embodiment. The power source circuit unit 110 is a power source that supplies potential necessary for occurrence of the avalanche multiplication in each of the photoelectric conversion elements 101. In the description, the power source circuit unit 110 supplies all the pixels with common potential.

The pixels 100 are not each necessarily provided with the function of the pixel signal processing unit 102. For example, the plurality of pixels 100 may share a single pixel signal processing unit 102, which may sequentially perform the signal processing on each of the pixels 100. The pixels 100 are arranged two-dimensionally in the pixel unit 106, but not necessarily, and may be arranged one-dimensionally.

The vertical scan circuit unit 103, the horizontal scan circuit unit 104, and the column circuits 105 may be disposed on a block basis when the pixel unit 106 is divided into blocks formed of a plurality of pixel columns or may be disposed on a pixel column basis. FIG. 10 illustrates an example of a block diagram of each of the pixels 100 in the present embodiment. The pixels 100 each include the photoelectric conversion element 101 and the pixel signal processing unit 102.

The pixels 100 each include an avalanche photodiode (APD 1), which is a photoelectric conversion element. The resistor element 2 is connected to the cathode of the APD 1, and the second potential VH, which is higher than the first potential VL supplied to the anode of the APD 1, is supplied to the cathode. The transistor 6 for quench signal feedback is connected to the anode of the APD 1, and the first potential VL supplied from the power source circuit 8 is applied to the source of the transistor 6. The power source circuit 8 is shared by the plurality of pixels 100.

The quench signal applied to the gate of the transistor 6 for quench signal feedback switches the state of the transistor 6 between the on-state and the off-state, and the first potential VL is applied to the anode when the source and the drain are electrically connected to each other (when state of transistor 6 is turn-on state).

As described above, potential is so supplied to the anode and the cathode of the APD 1 that reverse bias high enough for occurrence of the avalanche multiplication in the APD 1 is applied.

A signal line via which the voltage signal S1 is output branches off the node N between the APD 1 and the resistor element 2, and the voltage signal S1 is therefore input to the current detecting unit 3. The current detecting unit 3 detects occurrence of the avalanche current based on a change in the cathode potential produced by the resistor element 2 when the avalanche current occurs and outputs the pulse signal S2. The details of the current detecting unit 3 are the same as those in the first embodiment and will therefore not be described.

The signal S2 output from the current detecting unit 3 bifurcates into two signals. One of the signals is input to the counter circuit 4, which counts the pulses on the signal S2. The result of the counting is held as a detection signal. When a control pulse pRES is supplied via a drive line 207, the detection signal held by the counter circuit 4 is reset.

The vertical scan circuit unit 103 in FIG. 9 supplies a control pulse pSEL via a drive line 208 to a selection circuit 206, and the control pulse pSEL switches the electrical connection and disconnection between the counter circuit 4 and the signal lines 107 from one to the other. The selection circuit 206 can, for example, be one of a transistor and a buffer circuit for outputting the signal out of the pixel.

The other one of the two bifurcated wiring lines is connected to the quench signal generating unit 5, and the signal S2 is therefore input to the quench signal generating unit 5. The quench signal generating unit 5 responses to the signal S2 output from the current detecting unit 3 and outputs the one-shot pulse signal S3 having the pulse width W1 in response to a trigger, that is, when the signal S2 exceeds the threshold. The one-shot pulse signal S3 is input to the gate of the transistor 6 and electrically switches whether or not the potential VL is supplied to the anode of the APD 1 based on the signal level of the one-shot pulse signal S3.

As described above, the state of occurrence of the avalanche current signal produced in the APD 1 is fed back to the transistor 6, which is the switch, to change the potential at the anode of the APD 1, whereby the avalanche current can be reliably stopped.

Further, in the present embodiment, the potential for quenching is not superimposed on the potential supplied from the power source circuit 8 (or power source circuit 7), but the switch is used to control the electrical connection of the power source circuit to perform the quench action. Therefore, in an imaging apparatus in which a plurality of pixels shares a power source circuit or an imaging apparatus in which another element is connected to a power source circuit, the quench action performed by a pixel does not cause a change in the potential at the power source wiring shared by the other pixels. Variation in the photo-detection output in another pixel, no photo-detection, an effect on the other element can therefore be suppressed or avoided.

Third Embodiment

In the present embodiment, an imaging system using the imaging apparatus 200 according to the second embodiment including the photo-detection device according to the first embodiment will be described with reference to FIG. 11. The same configurations, effects, materials, functions, and methods as those illustrated in FIGS. 1, 9 and 10 have the same reference characters and will not be described in detail.

Figure 11:
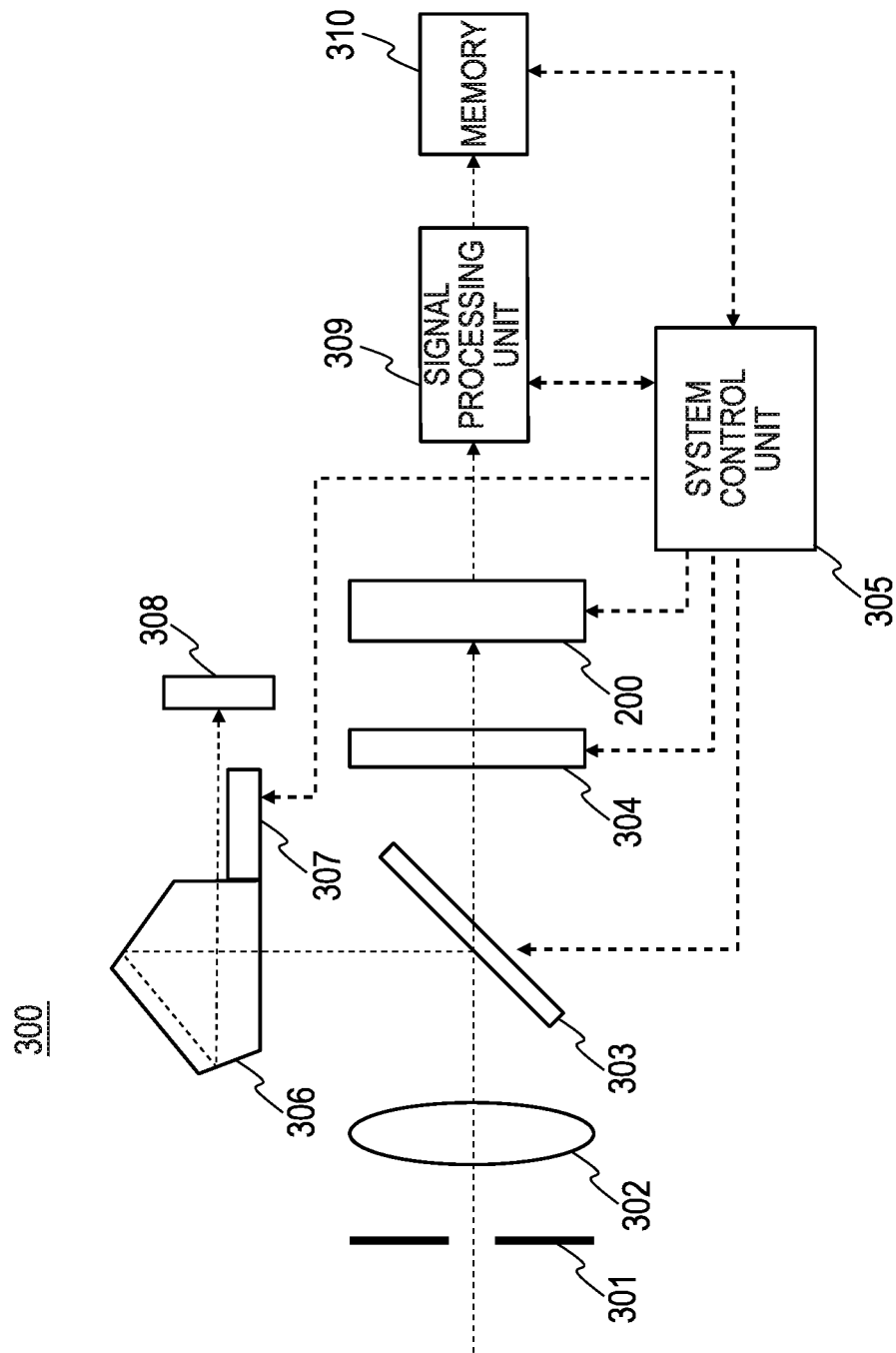
FIG. 11 illustrates an example of an imaging system 300 according to a third embodiment.

FIG. 11 is a block diagram for describing the configuration of an imaging system 300. In FIG. 11, the imaging apparatus 200 is disposed with respect to a light incident surface via a diaphragm mechanism 301, an imaging lens 302, a mirror unit 303, and a mechanical shutter 304.

The mirror unit 303 is a mirror that moves upward and downward in accordance with an instruction from a system controlling unit 305 in light exposure, a live-view imaging, and motion image capturing to switch the destination of an introduced light flux incident through the imaging lens 302 between a finder 308 and the imaging apparatus 200. An imaging signal output from the imaging apparatus 200 is sent to a signal processing unit 309, which performs image processing on the imaging signal, and the processed signal is then stored in a memory 310.

When the light flux is guided by the mirror unit 303 toward the finder 308, part of the light flux is incident via a pentagonal prism 306 on an AE sensor 307 for automatic exposure. The AE sensor measures the amount of light exposed to an object, and resultant information is input to the system controlling unit 305. The system controlling unit 305 adjusts and determines the pulse width W1 of the quench signal (one-shot pulse signal S3) appropriate for counting of photons incident on the imaging apparatus 200 in accordance with illuminance.

The thus adapted imaging system, which controls optimum quenching time based on the condition under which the object is exposed to light, can produce an imaging signal having a widened dynamic range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-199601, filed Oct. 13, 2017, which is hereby incorporated by reference herein in its entirety.

What is claimed is:

1. A photo-detection device comprising:
   an avalanche photodiode;
   a current detecting unit to which a signal via a first terminal of the avalanche photodiode is input, a load element connected to a node between the avalanche photodiode and the current detecting unit, and a quench signal generating unit to which a signal from the current detecting unit is input and which outputs a quench signal; and
   a switch connected to a second terminal of the avalanche photodiode and a first wiring line to which first potential is supplied,
   wherein the node is connected via the load element to a second wiring line to which second potential different from the first potential is supplied, and
   the quench signal generating unit is adapted to generate a one-shot pulse signal as the quench signal based on the signal from the current detecting unit and cause the quench signal to be input to the switch.

2. The photo-detection device according to claim 1, wherein the switch includes a transistor, and the quench signal is input to a gate of the transistor.

3. The photo-detection device according to claim 1, wherein the quench signal generating unit is adapted to generate the one-shot pulse signal as the quench signal when the signal from the current detecting unit exceeds a first threshold.

4. The photo-detection device according to claim 1, wherein a pulse width of the quench signal corresponds to a period at least longer than or equal to twice dead time of the avalanche photodiode but shorter than six times the dead time.

5. The photo-detection device according to claim 1, wherein the current detecting unit outputs as the signal a first signal when voltage at the node is greater than or equal to a second threshold and outputs as the signal a second signal when the voltage is smaller than the second threshold.

6. The photo-detection device according to claim 5, wherein the second threshold is a value between voltage at the node in a case where avalanche current flows through the avalanche photodiode and voltage at the node in a case where no avalanche current flows through the avalanche photodiode.

7. The photo-detection device according to claim 5, wherein the quench signal generating unit is adapted to generate the one-shot pulse signal as the quench signal when the signal from the current detecting unit exceeds a first threshold, and
   voltage carried by the first signal is greater than the first threshold, and voltage carried by the second signal is smaller than or equal to the first threshold.

8. The photo-detection device according to claim 1, further comprising a delay circuit unit that controls a pulse width of the quench signal.

9. The photo-detection device according to claim 1, wherein the first potential is so set that a difference between the first potential and the second potential is potential that causes reverse bias to be applied via the switch to the second terminal of the avalanche photodiode.

10. The photo-detection device according to claim 1, wherein the first potential and the second potential each have a value that causes avalanche current to flow through the avalanche photodiode when the switch operates in a turn-on state.

11. An imaging apparatus comprising:
    a plurality of the photo-detection devices according to claim 1;
    a first power source circuit that supplies the first wiring line of each of the plurality of photo-detection devices with the first potential; and
    a second power source circuit that supplies the second wiring line of each of the plurality of photo-detection devices with the second potential.

12. An imaging system comprising:
    a plurality of pixels; and
    a signal processing unit that processes signals from the plurality of pixels,
    wherein the plurality of pixels each include the photo-detection device according to claim 1.

* * * * *